US011753720B2

(12) United States Patent
Furuya et al.

(10) Patent No.: US 11,753,720 B2
(45) Date of Patent: Sep. 12, 2023

(54) FILM FORMING APPARATUS, SOURCE SUPPLY APPARATUS, AND FILM FORMING METHOD

(71) Applicant: TOKYO ELECTRON LIMITED, Tokyo (JP)

(72) Inventors: Yuichi Furuya, Nirasaki (JP); Masayuki Tanaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 700 days.

(21) Appl. No.: 16/514,039

(22) Filed: Jul. 17, 2019

(65) Prior Publication Data

US 2020/0024740 A1 Jan. 23, 2020

(30) Foreign Application Priority Data

Jul. 20, 2018 (JP) ................................ 2018-137083

(51) Int. Cl.

| | |
|---|---|
| ***C23C 16/40*** | (2006.01) |
| ***C23C 16/52*** | (2006.01) |
| ***C23C 16/16*** | (2006.01) |
| ***C23C 16/455*** | (2006.01) |
| ***C23C 16/448*** | (2006.01) |

(52) U.S. Cl.

CPC .............. *C23C 16/52* (2013.01); *C23C 16/16* (2013.01); *C23C 16/4481* (2013.01); *C23C 16/45561* (2013.01)

(58) Field of Classification Search

CPC ..... C23C 16/52; C23C 16/16; C23C 16/4481; C23C 16/45561; C23C 16/18; C23C 16/455; G05D 11/135; G01N 2021/3595

USPC ............................ 118/726, 727; 156/345.29

See application file for complete search history.

(56) References Cited

U.S. PATENT DOCUMENTS

| | | | |
|---|---|---|---|
| 5,665,608 A * | 9/1997 | Chapple-Sokol | C23C 16/4402 438/778 |
| 2002/0022087 A1* | 2/2002 | Satake | C30B 25/165 427/255.28 |
| 2004/0007180 A1* | 1/2004 | Yamasaki | C23C 16/4481 118/715 |

(Continued)

FOREIGN PATENT DOCUMENTS

| | | |
|---|---|---|
| CN | 101390450 A | 3/2009 |
| CN | 106191815 A | 12/2016 |

(Continued)

*Primary Examiner* — Rudy Zervigon

(74) *Attorney, Agent, or Firm* — Nath, Goldberg & Meyer; Jerald L. Meyer; Tanya E. Harkins

(57) ABSTRACT

A film forming apparatus for forming a film on a substrate by transferring a source gas generated from a low-vapor-pressure source to a process container by a carrier gas includes: a source container configured to receive and heat the low-vapor-pressure source; a first gas pipe configured to supply the carrier gas to the source container; a second gas pipe connecting the source container and the process container; a first opening and closing valve provided in the second gas pipe; and a measurement part configured to measure a flow rate of the source gas flowing through the second gas pipe, wherein the second gas pipe is disposed on a central axis of the process container, and wherein the source container is offset with respect to the central axis of the process container.

15 Claims, 3 Drawing Sheets

(56) References Cited

U.S. PATENT DOCUMENTS

2004/0015300 A1* 1/2004 Ganguli .................. C23C 16/52
702/24
2005/0115501 A1* 6/2005 Toriya .................. G05D 7/0635
118/715
2006/0278166 A1* 12/2006 Yamoto ............... C23C 16/4481
427/248.1
2007/0261735 A1* 11/2007 Yasumuro ........... G01F 23/2962
137/154
2009/0238972 A1* 9/2009 Clark ...................... C23C 16/24
118/712
2010/0022097 A1* 1/2010 Yamoto ............. C23C 16/45544
438/758
2011/0180002 A1* 7/2011 Tanaka ................ H01J 37/3244
118/726
2018/0251894 A1* 9/2018 Yamaguchi ....... H01L 21/28568

FOREIGN PATENT DOCUMENTS

JP 02104667 A 4/1990
JP 2009-84625 A 4/2009
JP 2014012869 A 1/2014
JP 2017-101295 A 6/2017
KR 10-2008-0106566 A 12/2008
KR 10-2010-0063694 A 6/2010
TW 200932943 A 8/2009
WO 2018/052074 A1 3/2018

* cited by examiner

FILM FORMING APPARATUS, SOURCE SUPPLY APPARATUS, AND FILM FORMING METHOD

CROSS-REFERENCE TO RELATED APPLICATION

This application is based upon and claims the benefit of priority from Japanese Patent Application No. 2018-137083, filed on Jul. 20, 2018, the entire contents of which are incorporated herein by reference.

TECHNICAL FIELD

The present disclosure relates to a film forming apparatus, a source supply apparatus, and a film forming method.

BACKGROUND

There is an existing technique of carrying a source gas generated by vaporizing a low-vapor-pressure source to a process container using a carrier gas so as to form a film on a substrate (see, for example, Patent Document 1).

PRIOR ART DOCUMENTS

Patent Documents

Patent Document 1: Japanese laid-open publication No. 2009-84625

SUMMARY

An aspect of the present disclosure provides a film forming apparatus for forming a film on a substrate by transferring a source gas generated from a low-vapor-pressure source to a process container by a carrier gas. The film forming apparatus includes: a source container configured to receive and heat the low-vapor-pressure source; a first gas pipe configured to supply the carrier gas to the source container; a second gas pipe connecting the source container and the process container; a first opening and closing valve provided in the second gas pipe; and a measurement part configured to measure a flow rate of the source gas flowing through the second gas pipe, wherein the second gas pipe is disposed on a central axis of the process container, and wherein the source container is offset with respect to the central axis of the process container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
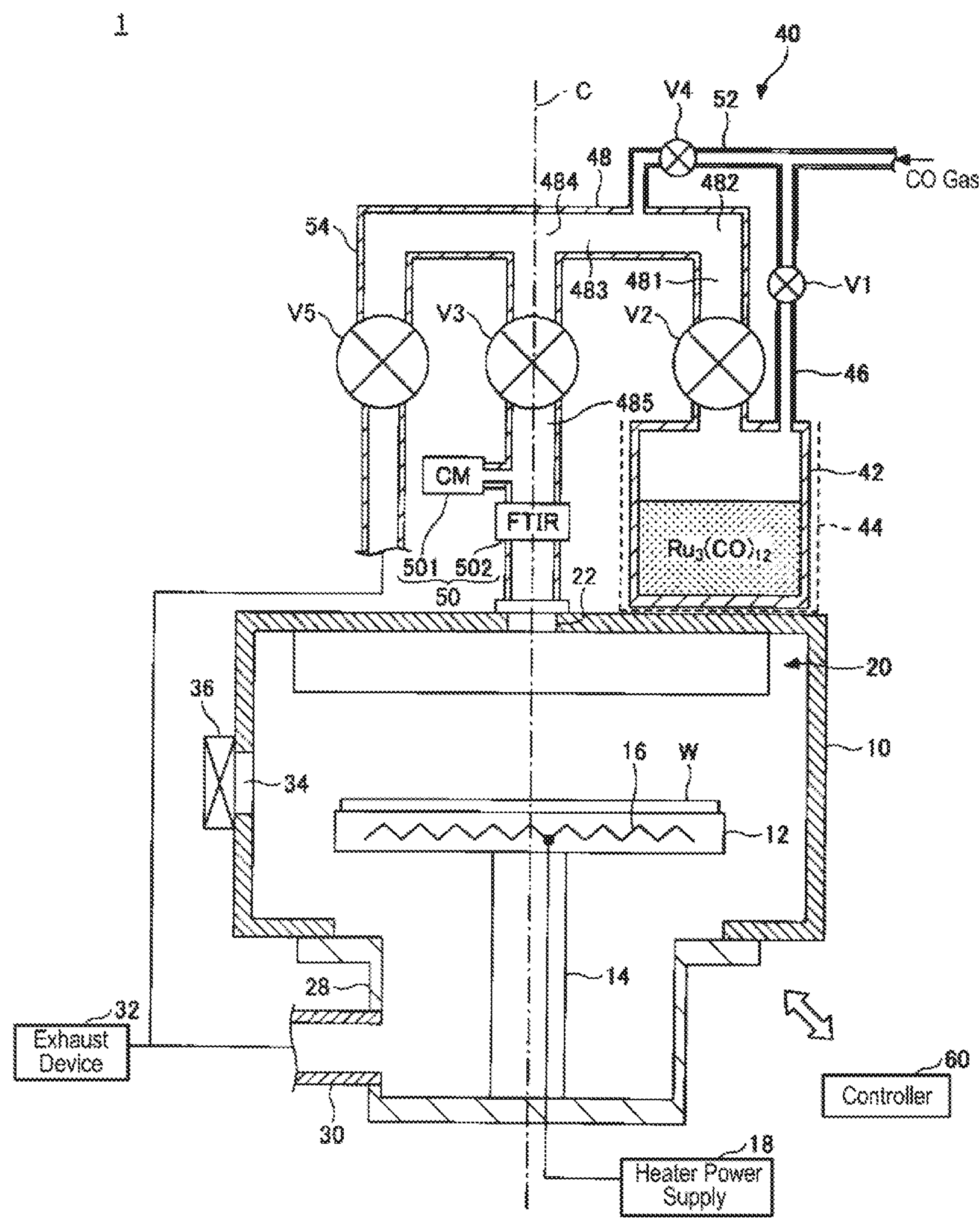
FIG. 1 is a schematic view illustrating a configuration of a film forming apparatus according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-restrictive embodiments of the present disclosure will be described with reference to the accompanying drawings. In all of the accompanying drawings, the same or corresponding members or components will be denoted by the same or corresponding reference numerals, and redundant descriptions will be omitted.

First Embodiment

As to a film forming apparatus according to a first embodiment, an apparatus for forming a ruthenium (Ru) film through a chemical vapor deposition (CVD) method will be described by way of example. FIG. 1 is a schematic view illustrating a configuration example of the film forming apparatus according to the first embodiment.

As illustrated in FIG. 1, a film forming apparatus 1 has a substantially cylindrical airtight process container 10. A susceptor 12 is provided in the process container 10. The susceptor 12 supports a semiconductor wafer (hereinafter referred to as "wafer W"), which is an example of a substrate, in a horizontal position. The susceptor 12 is supported by a substantially cylindrical support member 14 provided at the center of a bottom wall of the process container 10. A heater 16 is embedded in the susceptor 12. A heater power supply 18 is connected to the heater 16, and a heater controller (not illustrated) controls the heater power supply 18 based on a detection signal of a thermocouple (not illustrated) provided in the susceptor 12. Thus, the wafer W is controlled to a desired temperature via the susceptor 12. The susceptor 12 is provided with three lift pins (not illustrated) configured to protrude and retract with respect to the surface of the susceptor 12 so as to move the wafer W supported by the lift pins upward and downward.

A gas discharge mechanism 20 configured to uniformly introduce a process gas, which is for forming a Ru film, to the wafer W on the susceptor 12 in the process container 10 is provided on a ceiling wall of the process container 10 so as to face the susceptor 12. The gas discharge mechanism 20 discharges a gas supplied from a gas supply mechanism 40 (described later) to the interior of the process container 10. A gas introduction port 22, through which the gas is introduced, is formed above the gas discharge mechanism 20.

An exhaust chamber 28 protrudes downward from the bottom wall of the process container 10. An exhaust pipe 30 is connected to the lateral surface of the exhaust chamber 28. An exhaust device 32 having a vacuum pump and a pressure control valve is connected to the exhaust pipe 30. The exhaust device 32 evacuates the interior of the process container 10 so as to reduce the pressure in the process container 10 to a desired pressure.

A loading and unloading port 34, through which the wafer W is loaded and unloaded between the process container 10 and a transfer chamber (not illustrated) depressurized to a desired pressure, is provided in a side wall of the process container 10. The loading and unloading port 34 is opened or closed by a gate valve 36.

The gas supply mechanism 40 has a source container 42 receiving ruthenium carbonyl ($Ru_3(CO)_{12}$), which is an example of a low-vapor-pressure source. The source container 42 is arranged to be offset from the central axis C of the process container 10. Thus, a third straight pipe portion 485 of a source gas supply pipe 48 (described later) can be arranged on the central axis C of the process container 10. In addition, the source container 42 is disposed at a position higher than the process container 10, for example, above the ceiling wall of the process container 10. The width of the source container 42 is, for example, narrower than the width of the process container 10. A heater 44 is provided around the source container 42. By heating and sublimating $Ru_3(CO)_{12}$ in the source container 42 using the heater 44, $Ru_3(CO)_{12}$ gas is generated in the source container 42. A carrier gas supply pipe 46 and the source gas supply pipe 48 are inserted into the source container 42.

The carrier gas supply pipe 46 has one end inserted into the source container 42 and the other end connected to a carrier gas supply source (not illustrated). The carrier gas supply pipe 46 supplies CO gas, which is an example of the carrier gas supplied from the carrier gas supply source, to the source container 42 from above. The carrier gas supply pipe 46 is, for example, a pipe having a nominal diameter of ⅛ to ½ inches. An opening/closing valve V1 is provided in the carrier gas supply pipe 46.

The source gas supply pipe 48 has one end inserted into the source container 42 and the other end connected to the gas introduction port 22 of the gas discharge mechanism 20. The source gas supply pipe 48 is a large-diameter pipe having an outer diameter larger than that of the carrier gas supply pipe 46, and is, for example, a pipe having a nominal diameter of 40A to 80A. The source gas supply pipe 48 includes a plurality of straight pipe portions and a plurality of bent portions connecting the straight pipe portions. More specifically, the source gas supply pipe 48 includes a first straight pipe portion 481, a first bent portion 482, a second straight pipe portion 483, a second bent portion 484, and the third straight pipe portion 485 disposed in order from the side of the source container 42.

The first straight pipe portion 481 extends vertically upward from the source container 42, and the upper end of the first straight pipe portion 481 communicates with the first bent portion 482. The first bent portion 482 is bent in an L shape in the horizontal direction from the upper end of the first straight pipe portion 481, and communicates with the second straight pipe portion 483. The second straight pipe portion 483 extends in the horizontal direction from the first bent portion 482, and communicates with the second bent portion 484. The second bent portion 484 is bent in an L shape vertically downward from the second straight pipe portion 483, and communicates with the third straight pipe portion 485. The third straight pipe portion 485 extends vertically downward from the second bent portion 484, and communicates with the gas introduction port 22. With this configuration, even if particles are generated in the source container 42, the particles are trapped by the first straight pipe portion 481, which forms a flow path directed vertically upward. Thus, it is possible to suppress the particles from entering the process container 10.

In addition, since the third straight pipe portion 485 is disposed on the central axis C of the process container 10, disturbance of a gas flow that may occur in the first bent portion 482 and the second bent portion 484 is reduced by the third straight pipe portion 485, making it possible to supply a uniform flow of $Ru_3(CO)_{12}$ gas to the gas introduction port 22. Therefore, it is possible to stably supply the $Ru_3(CO)_{12}$ gas at a high flow rate.

The length of the third straight pipe portion 485 may in some embodiments be longer than the lengths of the first straight pipe portion 481 and the second straight pipe portion 483. In this configuration, it is possible to reduce disturbance of the gas flow that may occur, particularly, in the first bent portion 482 and the second bent portion 484. The pipe length of the source gas supply pipe 48 may be 0.3 m to 1.0 m.

An opening and closing valve V2, an opening and closing valve V3, and a measurement part 50 are provided in the source gas supply pipe 48 in this order from the side of the source container 42. The measurement part 50 measures the flow rate of the $Ru_3(CO)_{12}$ gas flowing through the source gas supply pipe 48. The measurement part 50 may include a capacitance manometer 501 and a Fourier transform infrared spectrometer (FTIR) 502. The capacitance manometer 501 detects a pressure (total pressure) in the source gas supply pipe 48. The FTIR 502 measures a partial pressure of the $Ru_3(CO)_{12}$ gas flowing in the source gas supply pipe 48. Based on the flow rate of the CO gas, the total pressure in the source gas supply pipe 48, and the partial pressure of the $Ru_3(CO)_{12}$ gas flowing in the source gas supply pipe 48, the flow rate of the $Ru_3(CO)_{12}$ flowing in the source gas supply pipe 48 is calculated. As described above, since the flow rate of the $Ru_3(CO)_{12}$ gas flowing in the source gas supply pipe 48 is measured using the FTIR 502, conductance of the source gas supply pipe 48 is not decreased. Therefore, it is possible to supply the $Ru_3(CO)_{12}$ gas generated from $Ru_3(CO)_{12}$, which is a low-vapor-pressure source, into the process container 10 at a high flow rate. When the flow rate of the $Ru_3(CO)_{12}$ gas flowing in the source gas supply pipe 48 is measured using a mass flow controller, conductance of the source gas supply pipe 48 is decreased. Therefore, it is difficult to supply the $Ru_3(CO)_{12}$ gas generated from $Ru_3(CO)_{12}$, which is a low-vapor-pressure source, into the process container 10 at a high flow rate.

A bypass pipe 52 is provided so as to connect a location in the carrier gas supply pipe 46 between the opening and closing valve V1 and the carrier gas supply source and a location in the source gas supply pipe 48 between the opening and closing valve V2 and the opening and closing V3. An opening and closing valve V4 is provided in the bypass pipe 52. By closing the opening and closing valves V1 and V2 and opening the opening and closing valves V4 and V3, the CO gas supplied from the carrier gas supply source is supplied to the source gas supply pipe 48 via the carrier gas supply pipe 46 and the bypass pipe 52 without passing through the source container 42. Thus, the source gas supply pipe 48 can be purged.

An Evac pipe 54 is branched out from the middle of the source gas supply pipe 48 to evacuate the source gas supply pipe 48. The Evac pipe 54 has one end connected to a location in the source gas supply pipe 48 between the opening and closing valve V2 and the opening and closing valve V3 and the other end connected to the exhaust pipe 30. An opening and closing valve V5 is provided in the Evac pipe 54. By closing the opening and closing valves V3 and V4 and opening the opening and closing valves V1, V2, and V5, CO gas is introduced into the source container 42 from the carrier gas supply source through the carrier gas supply pipe 46. Then, the $Ru_3(CO)_{12}$ gas sublimated in the source container 42 is transferred by the CO gas, and is exhausted through the source gas supply pipe 48 and the Evac pipe 54. With this configuration, it is possible to supply $Ru_3(CO)_{12}$ gas to the process container 10 after the flow rate of $Ru_3(CO)_{12}$ gas is stabilized in a state where $Ru_3(CO)_{12}$ gas is supplied to the Evac pipe 54 without being supplied to the process container 10.

In the gas supply mechanism 40, by closing the opening and closing valves V4 and V5 and opening the opening and closing valves V1, V2, and V3, CO gas is introduced into the source container 42 from the carrier gas supply source through the carrier gas supply pipe 46. Then, the $Ru_3(CO)_{12}$ gas sublimated in the source container 42 is transferred by the CO gas, and is supplied to the process container 10 through the source gas supply pipe 48 and the gas discharge mechanism 20. In addition, by closing the opening and closing valves V3 and V4 and opening the opening and closing valves V1, V2, and V5, CO gas is introduced into the source container 42 from the carrier gas supply source through the carrier gas supply pipe 46. Then, the $Ru_3(CO)_{12}$ gas sublimated in the source container 42 is transferred by the CO gas, and is exhausted through the source gas supply pipe 48 and the Evac pipe 54 by the exhaust device 32.

The film forming apparatus 1 includes a controller 60 that controls the overall operation of the film forming apparatus 1. The controller 60 includes a central processing unit (CPU), a read only memory (ROM), and a random-access memory (RAM). The CPU executes a desired film forming process according to a recipe stored in a storage area of the RAM or the like. In the recipe, control information on devices is set in association with process conditions. The control information may include, for example, a gas flow rate, a pressure, a temperature, and a process time. A program used by the recipe and the controller 60 may be stored in, for example, a hard disk or semiconductor memory. In addition, the recipe may be set in a predetermined position and read out in the state where the recipe is stored in a storage medium readable by a portable computer, such as a CD-ROM or a DVD. In addition, the controller 60 may be provided separately from the film forming apparatus 1.

In addition, the controller 60 controls the degree to which the opening and closing valve V3 opens based on the flow rate of the $Ru_3(CO)_{12}$ gas measured by the measurement part 50. For example, the controller 60 controls the degree to which the opening and closing valve V3 opens such that the flow rate of the $Ru_3(CO)_{12}$ gas measured by the measurement part 50 is kept constant. Specifically, when the flow rate of the $Ru_z(CO)_{12}$ gas measured by the measurement part 50 is smaller than a predetermined set flow rate, the controller 60 controls the degree to which the opening and closing valve V3 opens to be increased. As this decreases the pressure in the source container 42, the amount of the $Ru_3(CO)_{12}$ gas generated by sublimation of $Ru_3(CO)_{12}$ in the source container 42 is increased. As a result, the flow rate of the $Ru_3(CO)_{12}$ gas supplied to the process container 10 is increased, and approaches the predetermined set flow rate. Meanwhile, when the flow rate of the $Ru_3(CO)_{12}$ gas measured by the measurement part 50 is greater than a predetermined set flow rate, the controller 60 controls the opening degree of the opening and closing valve V3 to be reduced. Since such a control increases the pressure in the source container 42, the amount of $Ru_3(CO)_{12}$ gas generated by sublimation of $Ru_3(CO)_{12}$ in the source container 42 is decreased. As a result, the flow rate of $Ru_3(CO)_{12}$ gas supplied to the process container 10 is decreased, and approaches the predetermined set flow rate.

In addition, the controller 60 calculates a remaining amount of $Ru_3(CO)_{12}$ in the source container 42 based on the flow rate of the $Ru_3(CO)_{12}$ gas measured by the measurement part 50. For example, the controller 60 calculates a used amount of $Ru_3(CO)_{12}$ based on the flow rate of the $Ru_3(CO)_{12}$ gas measured by the measurement part 50 and a supply time of the $Ru_3(CO)_{12}$ gas. Then, the controller 60 calculates the remaining amount of $Ru_3(CO)_{12}$ by subtracting the used amount of $Ru_3(CO)_{12}$ from an amount of $Ru_3(CO)_{12}$ immediately after replacing the source container 42. The controller 60 may display the calculated remaining amount of $Ru_3(CO)_{12}$ on a display (not illustrated) of the film forming apparatus 1. In addition, the controller 60 may predict a replacement cycle of the source container 42 based on the calculated remaining amount of $Ru_3(CO)_{12}$, and may display the prediction result on the display.

Next, a method of forming a Ru film in the film forming apparatus 1 of the first embodiment will be described. The following film forming method is executed by controlling each part of the film forming apparatus 1 using the controller 60. In the following description, it is assumed that all of the opening and closing valves V1 to V5 are closed in an initial state.

First, the gate valve 36 is opened, and a wafer W is loaded into the process container 10 from the loading and unloading port 34 and is placed on the susceptor 12. The wafer W is heated on the susceptor 12 which has been heated by the heater 16 to a desired temperature (e.g., 100 degrees C. to 300 degrees C.). Subsequently, the interior of the process container 10 is evacuated by the vacuum pump of the exhaust device 32, and is depressurized to a predetermined pressure (e.g., 1 Pa to 100 Pa).

Subsequently, by opening the opening and closing valves V1 and V2, CO gas as a carrier gas is blown into the source container 42 through the carrier gas supply pipe 46. In addition, by heating the source container 42 using the heater 44, $Ru_3(CO)_{12}$ is sublimated in the source container 42 and $Ru_3(CO)_{12}$ gas is generated. In addition, by opening the opening and closing valve V3, $Ru_3(CO)_{12}$ gas is transferred by the CO gas, and is introduced into the process container 10 through the source gas supply pipe 48 and the gas discharge mechanism 20. Therefore, ruthenium (Ru) generated by thermal decomposition of $Ru_3(CO)_{12}$ gas is deposited on the surface of the wafer W, and an Ru film having a predetermined film thickness is formed on the surface of the wafer W.

At this time, the measurement part 50 measures the flow rate of $Ru_3(CO)_{12}$ gas flowing in the source gas supply pipe 48. Then, the controller 60 controls the degree to which the opening and closing valve $V_3$ opens based on the flow rate of the $Ru_3(CO)_{12}$ gas measured by the measurement part 50 such that the flow rate of $Ru_3(CO)_{12}$ gas introduced into the process container 10 is kept constant. In this way, the flow rate of $Ru_3(CO)_{12}$ gas introduced into the process container 10 is controlled base on the flow rate of the $Ru_3(CO)_{12}$ gas measured by the measurement part 50 (the capacitance manometer 501 and the FTIR 502) provided in the vicinity of the process container 10. Therefore, it is possible to control the flow rate of the $Ru_3(CO)_{12}$ gas introduced into the process container 10 with high accuracy.

In some embodiments, before introducing the $Ru_3(CO)_{12}$ gas into the process container 10, by opening the opening and closing valves V1, V2, and V5 in a state where the opening and closing valves V3 and V4 are closed, $Ru_3(CO)_{12}$ gas may be exhausted through the Evac pipe 54 together with the CO gas for a predetermined time. This makes it possible to supply the $Ru_3(CO)_{12}$ gas into the process container 10 after the flow rate of $Ru_3(CO)_{12}$ gas sublimated in the source container 42 is stabilized without being supplied to the process container 10.

As described above, according to the first embodiment, the source gas supply pipe 48 is disposed on the central axis C of the process container 10, and the source container 42 is arranged to be offset with respect to the central axis C of the process container 10. Thus, it is possible to reduce disturbance of the gas flow in the source gas supply pipe 48 and to supply a uniform flow of $Ru_3(CO)_{12}$ to the gas introduction port 22. As a result, it is possible to stably supply $Ru_3(CO)_{12}$ gas at a high flow rate.

Second Embodiment

Figure 2:
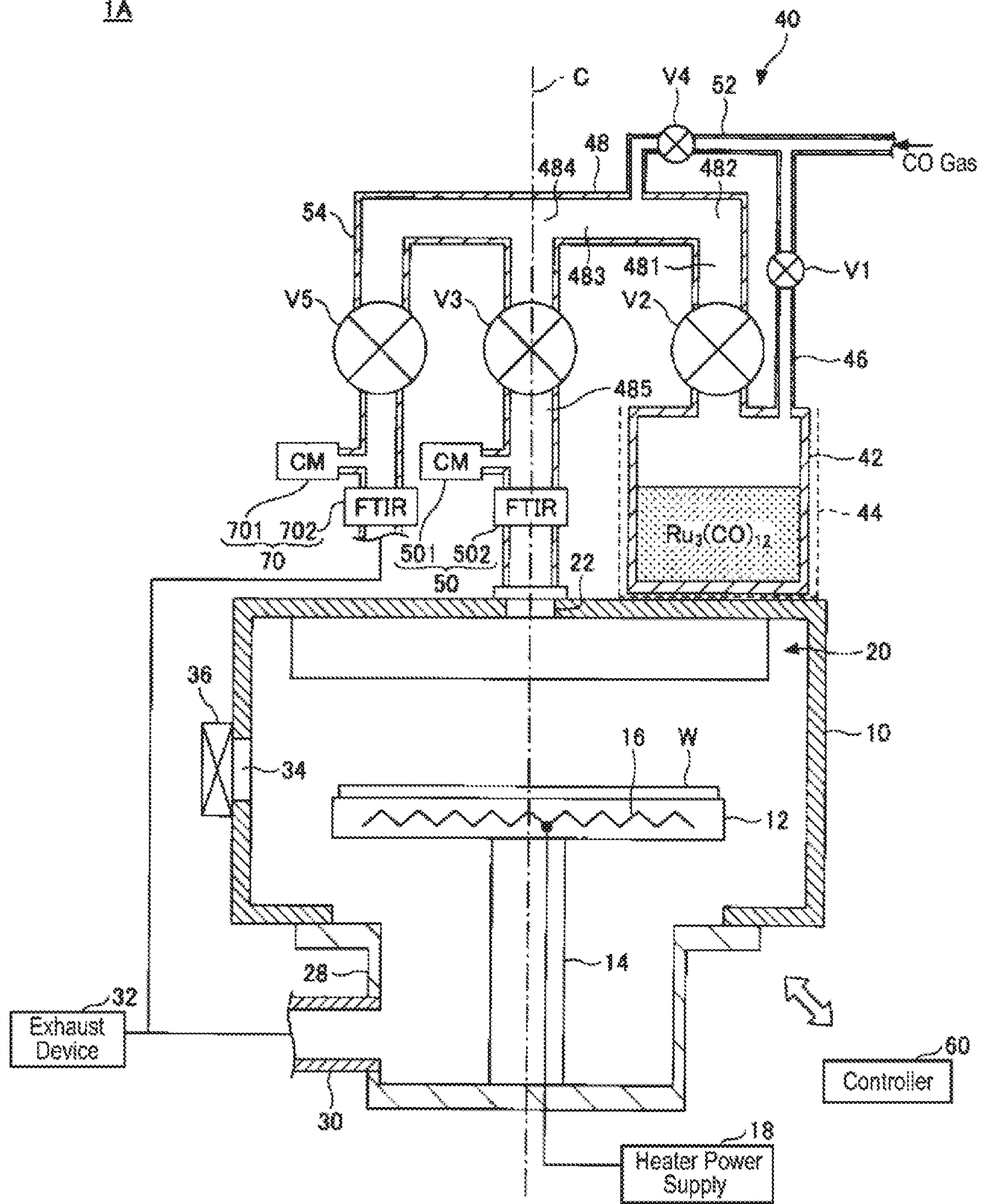
FIG. 2 is a schematic view illustrating a configuration of a film forming apparatus according to a second embodiment.

A film forming apparatus according to a second embodiment will be described. FIG. 2 is a schematic view illustrating a configuration of the film forming apparatus according to the second embodiment.

As illustrated in FIG. 2, in a film forming apparatus IA of the second embodiment, a second measurement part 70 including a capacitance manometer 701 and a FTIR 702 is provided at the downstream side of the opening and closing valve V5 in the Evac pipe 54. The capacitance manometer 701 and the FTIR 702 may have the same configuration as the capacitance manometer 501 and the FTIR 502 provided in the source gas supply pipe 48. Since the other components are the same as those of the first embodiment, differences will be mainly described in this section.

In the second embodiment, the flow rate of the $Ru_3(CO)_{12}$ gas flowing through the Evac pipe 54 is measured by the second measurement part 70 in a state where the $Ru_3(CO)_{12}$ gas and CO gas flow in the Evac pipe 54 by closing the opening and closing valve V3 and opening the opening and closing valve V5. Then, the controller 60 controls the degree to which the opening and closing valve V5 opens such that the flow rate of the $Ru_3(CO)_{12}$ gas measured by the second measurement part 70 is kept constant. In addition, the controller 60 controls the degree to which the opening and closing valve V3 opens based on the degree to which the opening and closing valve V5 opens when the flow rate of the $Ru_3(CO)_{12}$ gas flowing through the Evac pipe 54 becomes constant. Subsequently, $Ru_3(CO)_{12}$ gas is introduced into the process container 10 by closing the opening and closing valve V5 and opening the opening and closing valve V3. This shortens a time required for the flow rate of the $Ru_3(CO)_{12}$ gas flowing through the source gas supply pipe 48 to reach a predetermined set flow rate. As a result, it is possible to shorten a time until the flow rate of $Ru_3(CO)_{12}$ gas is stabilized after $Ru_3(CO)_{12}$ gas is supplied to the process container 10.

Third Embodiment

Figure 3:
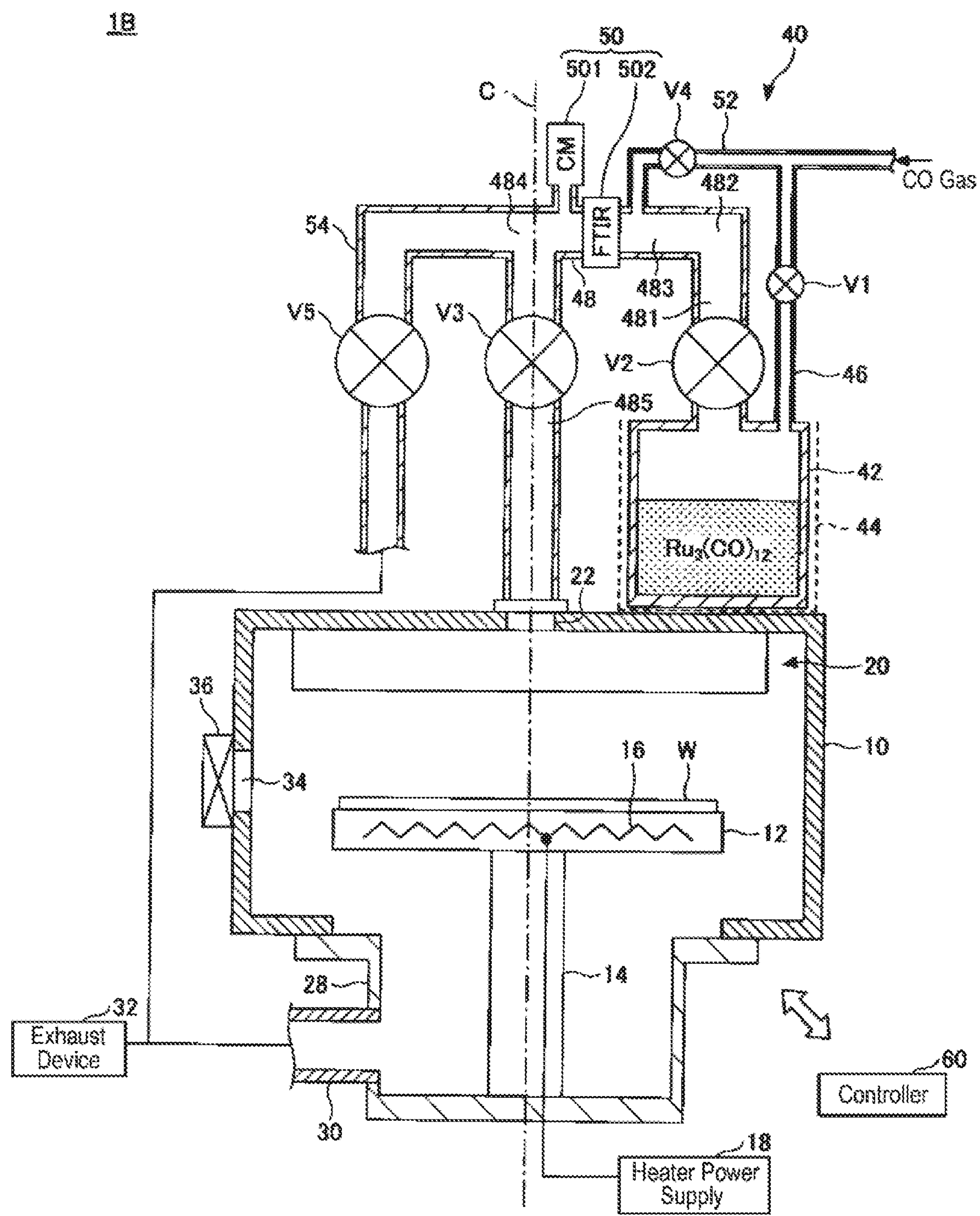
FIG. 3 is a schematic view illustrating a configuration of a film forming apparatus according to a third embodiment.

A film forming apparatus according to a third embodiment will be described. FIG. 3 is a schematic view illustrating a configuration of the film forming apparatus according to the third embodiment.

As illustrated in FIG. 3, in ae film forming apparatus 1B of the third embodiment, the measurement part 50 is provided at a position closer to the source container 42 than the branch point of the Evac pipe 54. Since the other components are the same as those of the first embodiment, differences will be mainly described in this section.

In the third embodiment, the opening and closing valve V2, the measurement part 50, and the opening and closing valve V3 are provided in the source gas supply pipe 48 in this order from the side of the source container 42, and the measurement part 50 is provided at a location closer to the source container 42 than the branch point of the Evac pipe 54.

In the third embodiment, the flow rate of $Ru_3(CO)_{12}$ gas flowing through the Evac pipe 54 is measured by the measurement part 50 in a state where $Ru_3(CO)_{12}$ gas and CO gas flow in the Evac pipe 54 by closing the opening and closing valve V3 and opening the opening and closing valve V5. Then, the controller 60 controls the opening degree of the opening and closing valve V5 such that the flow rate of $Ru_3(CO)_2$ gas measured by the measurement part 50 is kept constant. In addition, the controller 60 controls the degree to which the opening and closing valve V3 opens based on the degree to which the opening and closing valve V5 opens when the flow rate of the $Ru_3(CO)_{12}$ gas flowing through the Evac pipe 54 becomes constant. Subsequently, $Ru_3(CO)_{12}$ gas is introduced into the process container 10 by closing the opening and closing valve V5 and opening the opening and closing valve V3. This shortens a time required for the flow rate of the $Ru_3(CO)_{12}$ gas flowing through the source gas supply pipe 48 to reach a predetermined set flow rate. As a result, it is possible to shorten a time until the flow rate of the $Ru_3(CO)_{12}$ gas is stabilized after $Ru_3(CO)_{12}$ gas is supplied to the process container 10.

In the third embodiment, it is possible to measure the flow rate of the $Ru_3(CO)_{12}$ gas flowing through the Evac pipe 54 and the flow rate of the $Ru_3(CO)_{12}$ gas flowing through the source gas supply pipe 48 by the single measurement part 50.

In the above embodiments, the carrier gas supply pipe 46 is an example of a first gas pipe, the source gas supply pipe 48 is an example of a second gas pipe, the gas supply mechanism 40 is an example of a source supply, the opening and closing valve V5 is an example of a second opening and closing valve, and the opening and closing valve V3 is an example of a first opening and closing valve.

Although the above-mentioned embodiments have been described with a case where the low-vapor-pressure source is $Ru_3(CO)_{12}$, the present disclosure is not limited thereto, and another source may be used as the low-vapor-pressure source as long as the source has a vapor pressure that ranges from 0.1 Pa to 100 Pa at 80 degrees C. Tungsten hexachloride ($WC_{16}$) may be an example of such a source.

According to the present disclosure, it is possible to stably supply a source gas generated from a low-vapor-pressure source at a high flow rate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a film on a substrate by transferring a source gas generated from a low-vapor-pressure source to a process container by a carrier gas, the apparatus comprising:

- a source container configured to receive and heat the low-vapor-pressure source;
- a first gas pipe configured to supply the carrier gas to the source container;
- a second gas pipe connecting the source container and the process container;
- a first opening and closing valve provided in the second gas pipe; and
- a Fourier transform infrared spectrometer and a capacitance manometer provided in the second gas pipe, wherein the second gas pipe comprises a plurality of straight pipe portions and a plurality of bent portions connecting the plurality of straight pipe portions, wherein at least one of the plurality of straight pipe portions is disposed on a central axis of the process container, and wherein the source container is offset with respect to the central axis of the process container.

2. The film forming apparatus of claim 1, wherein one straight pipe portion among the plurality of straight pipe portions, which has one end connected to the process container, has a pipe length greater than other straight pipe portions.

3. The film forming apparatus of claim 1, wherein the source container is disposed at a position higher than the process container.

4. The film forming apparatus of claim 1, wherein the source container has a width narrower than a width of the process container.

5. The film forming apparatus of claim 1, further comprising: a controller configured to control a degree to which the first opening and closing valve opens, wherein the controller controls the degree to which the first opening and closing valve opens based on a flow rate of the source gas.

6. The film forming apparatus of claim 5, wherein the controller performs a control to increase the degree to which the first opening and closing valve opens when the flow rate of the source gas is less than a predetermined set flow rate.

7. The film forming apparatus of claim 5, wherein the controller performs a control to decrease the degree to which the first opening and closing valve opens when the flow rate of the source gas is greater than a predetermined set flow rate.

8. The film forming apparatus of claim 5, further comprising: an Evac pipe branched from a middle of the second gas pipe and configured to evacuate the second gas pipe, wherein the first opening and closing valve is provided at locations closer to the process container than a branch point of the Evac pipe.

9. The film forming apparatus of claim 8, further comprising:

a second opening and closing valve provided in the Evac pipe.

10. The film forming apparatus of claim 9, wherein the controller controls a degree to which the second opening and closing valve opens based on the flow rate of the source gas.

11. The film forming apparatus of claim 10, wherein the controller controls the degree to which the first opening and closing valve opens based on the degree to which the second opening and closing valve opens.

12. The film forming apparatus of claim 5, further comprising: an Evac pipe branched from a middle of the second gas pipe and configured to evacuate the second gas pipe, wherein the first opening and closing valve is provided at locations closer to the source container than a branch point of the Evac pipe.

13. The film forming apparatus of claim 5, wherein the controller calculates a remaining amount of the low-vapor-pressure source in the source container based on the flow rate of the source gas.

14. The film forming apparatus of claim 1, wherein the low-vapor-pressure source is $Ru_3(CO)_{12}$, and wherein the carrier gas is CO gas.

15. A source supply apparatus for transferring a source gas generated from a low-vapor-pressure source to a process container by a carrier gas, the apparatus comprising:

a source container configured to receive and heat the low-vapor-pressure source;

a first gas pipe configured to supply the carrier gas to the source container;

a second gas pipe connecting the source container and the process container;

an opening and closing valve provided in the second gas pipe; and a Fourier transform infrared spectrometer and a capacitance manometer provided in the second gas pipe, wherein the second gas pipe comprises a plurality of straight pipe portions and a plurality of bent portions connecting the plurality of straight pipe portions, wherein at least one of the plurality of straight pipe portions is disposed on a central axis of the process container, and wherein the source container is offset with respect to the central axis of the process container.

* * * * *